United States Patent [19]

Horaguchi et al.

[11] Patent Number: 4,922,287
[45] Date of Patent: May 1, 1990

[54] EXPOSURE DEVICE IN IMAGE RECORDING APPARATUS

[75] Inventors: Yoichi Horaguchi, Nagoya; Takashi Tomizawa, Aichi; Shigeyuki Hayashi, Nagoya; Motoshi Ohno, Nagoya; Takashi Nakata, Nagoya, all of Japan

[73] Assignee: Brother Kogyo Kabushiki Kaisha, Aichi, Japan

[21] Appl. No.: 255,399

[22] Filed: Oct. 11, 1988

[30] Foreign Application Priority Data

Oct. 14, 1987 [JP] Japan .................................. 62-156916

[51] Int. Cl.$^5$ ............................................ G03B 27/32
[52] U.S. Cl. .......................................... 355/27; 355/67
[58] Field of Search ................... 355/27, 28, 67–70, 355/30, 51, 57, 49, 35; 313/110; 362/326, 346, 297, 301, 303

[56] References Cited

U.S. PATENT DOCUMENTS

| | | | |
|---|---|---|---|
| 3,532,424 | 10/1970 | Miles | 355/30 |
| 4,518,249 | 5/1985 | Murata et al. | 355/51 |
| 4,519,019 | 5/1985 | Hall | 362/297 |

Primary Examiner—L. T. Hix
Assistant Examiner—Khanh Dang
Attorney, Agent, or Firm—Oliff & Berridge

[57] ABSTRACT

An exposure device having a light source section which includes a light source and a pair of light reflection means. One of the light reflection means is disposed movable toward and away from remaining reflection means so as to provide an open space for facilitating handling such as replacement of the light source.

3 Claims, 2 Drawing Sheets

EXPOSURE DEVICE IN IMAGE RECORDING APPARATUS

BACKGROUND OF THE INVENTION

The present invention relates to an exposure device for use in an image recording apparatus such as a copying machine.

A conventional exposure device for use in a copying machine has its back surface surrounded by a reflector in order to effectively collect light from a light source. In such a type, the light source and reflector are securely coupled together, thus making the necessary replacement of the light source significantly troublesome.

Photosensitive, pressure-sensitive recording mediums, are disclosed in Japanese Patent Application Kokai No. 58-23025, U.S. Pat. No. 4,399,209, and U.S. Pat. No. 4,440,846. U.S. Pat. No. 4,440,846 discloses a self-contained type recording medium in which an encapsulated chromogenic material or dye precursor and a developer material are codeposited on one surface of a single substrate as one layer or as two contiguous layers. U S. Pat. No. 4,399,209 discloses a transfer type recording medium in which the developer material is coated on a separate substrate as a separate developer or copy sheet. Such recording mediums, due to a low photosensitivity, require a large amount of light from a light source. A copying machine involving this type of recording medium uses a 1200 to 1400 W light source, almost twice as large as the one (500 to 600 W) used in an ordinary copying machine. As a result, a filament of a light source is frequently burnt out Copending U.S. patent applications commonly assigned have been filed relating to the exposure device, U.S. Ser. Nos. 183,050 filed Apr. 19, 1988, 203,105 filed June 7, 1988, 204,239 filed June 9, 1988, and 218,219 filed July 13, 1988.

SUMMARY OF THE INVENTION

Accordingly, it is an object of this invention to provide an exposure device which overcomes the above problem and facilitates the replacement of its light source.

To achieve the object, according to this invention, there is provided an exposure device in an image recording apparatus in which an image is formed on an image recording medium which image corresponds to an image of an original; the exposure device comprising: a light source having a back peripheral surface; and a reflector means surrounding the back surface of the light source for reflecting a light from the light source onto an original. The reflector means comprises first and second separate bisected reflector members, and at least one of the first and second reflector members is disposed movable toward and away from remaining reflector member. Accordingly, open space is provided for facilitating handling of said light source.

The above arrangement provides space between the light source and reflector to permit an operator to insert his hand therethrough for easy replacement of the light source.

DETAILED DESCRIPTION OF THE PREFERRED EMBODIMENT

One embodiment of this invention as used in a copying machine will be described below with reference to the accompanying drawings. In this embodiment, used as a photosensitive sheet is a transfer type color photosensitive, pressure-sensitive recording sheet as proposed in U.S. Pat. No. 4,399,209, which comprises a microcapsule sheet and a developer sheet, However, other types of photosensitive sheets such as self-contained type may also be available.

The transfer type image recording medium generally includes a first image recording medium comprising a photosensitive pressure sensitive recording medium provided with microcapsules, and a second image recording medium comprising a developer medium. The microcapsules encapsulate therein a first material having first and second phases dependent on light exposure. The developer medium of the second image recording medium is provided with a second material which provides an output image upon reaction with the first material. Mechanical strength of the first material is changeable upon irradiation of light. That is, if the microcapsules undergo light exposure, such microcapsules will be photo-cured (second phase), so that they are never ruptured in a subsequent pressure application. However, remaining microcapsules not undergoing light exposure will be ruptured (first phase) in the pressure application process, so that the first material can be flowed to react with the second material.

Figure 1:
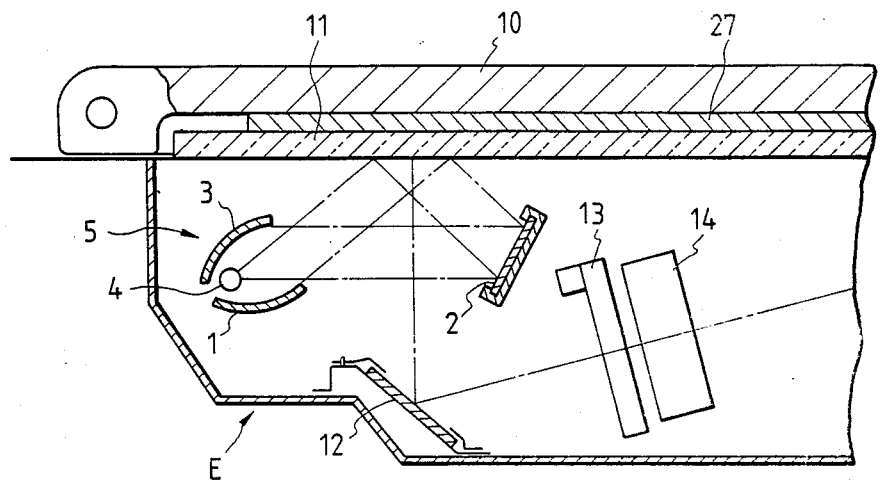
FIG. 1 is an enlarged cross-sectional view showing an essential section of an exposure device according to this invention.
Figure 4:
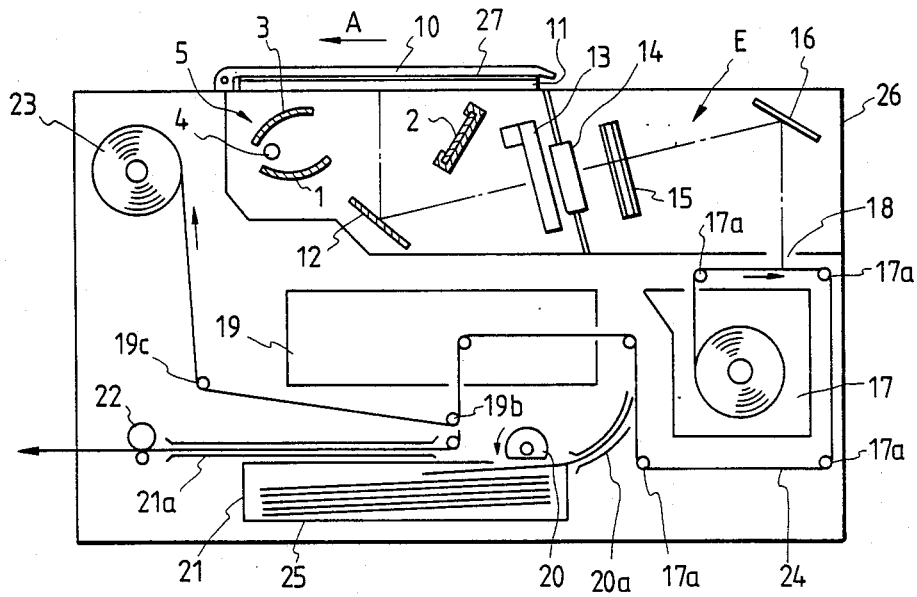

As shown in FIGS. 1 and 4, a copying machine has an original support stand cover 10 mounted on the upper portion of a machine main body 26. Under the cover 10, provided is an original support sand glass. An original 27 is placed, with its imaging surface facing the glass between the cover 10 and the glass 11.

Under the glass 11, there is provided an exposure device E which includes a light source section 5 for irradiating light onto the original 27. The light source section 5 includes a light source 4 and a pair of separate bisected reflector members 1 and 3. The back surface of the light source 4 is surrounded by the pair of reflector members 1 and 3. The reflector member 1 has an oval surface so as to reflect the light from the light source 4 and to direct the reflected light directly onto the original 27. The reflector member 1 is disposed in such a way that the light source 4 is positioned on the focal point of the member 1. Another reflector member 3 has a parabolic surface and is so mounted as to set the light source 4 on focal point of the member 3. In the exposure device E, a flat mirror 2 is provided with confronting the reflector members. The light reflected at the surface of the reflector member 3 impinges on the flat mirror 2, and is reflected to direct toward the original 27.

Figure 2:
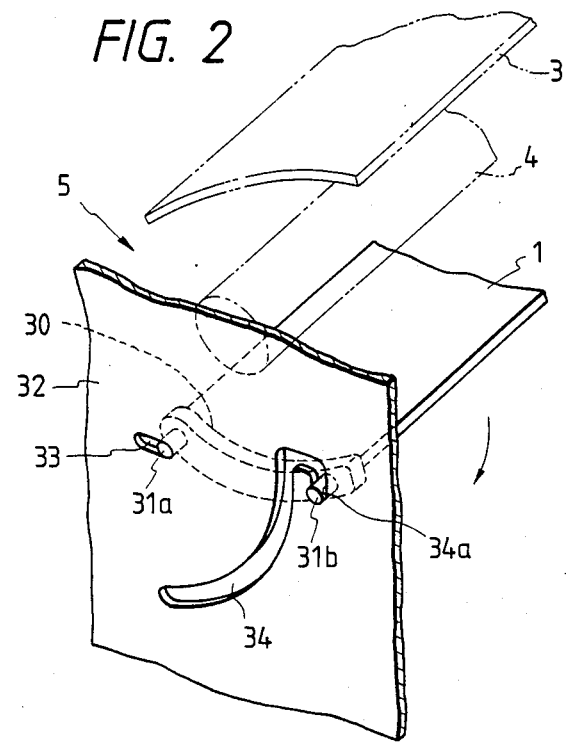
FIG. 2 is a perspective view showing this essential section.

FIG. 2 illustrates the reflector member 1 mounted at a side plate 32 of the machine main body 26. As shown, a holder 30 is secured at one side face of the reflector member 1, and has guide pins 31a and 31b projecting respectively from its proximal and distal ends. The guide pin 31a is loosely fitted in an elongated slot 33 formed in the side plate 32, while the other guide pin 31b is fitted in a guide groove 34 formed in an arcuate shape whose radius center is at the elongated slot 33. Further, a latch hole 34a is formed contiguous with the arcuate groove 34. In the normal mode, the guide pin 31b is engaged in the larch hole 34a formed at one end of the guide groove 34.

Under the glass 11, there are provided an optical system in the exposure unit. The optical system includes a light path changing mirror 12, a shutter 13, a light-collecting lens 14, a chromatic resolution filter 15, and a reflection mirror 16. The light path changing mirror 12 is disposed to guide the light reflected at the surface of the original in a specific direction. The shutter 13 is adapted for shielding or passing the light reflected at the mirror 12. The light-collecting lens 14 and the filter 15 are adapted for selectively passing light with predetermined wavelength components, such as cyan, magenta and yellow lights. The light passing the filter 15 is guided through the reflection mirror 16 to an exposure section 18 where a photosensitive recording medium is subjected to light irradiation.

Entire copying mechanism will be briefly described. The recording medium such as a microcapsule sheet 24 is in a continuous sheet roll form as shown in FIG. 4, and is accommodated in a sheet cartridge 17. The sheet 24 is pullingly guided by means of a plurality of feed rollers 17a and 17a from the cartridge 17. The microcapsule sheet 24 passes through an exposure zone 18 positioned above the sheet cartridge 17, a pressure developing unit 19 positioned downstream of the exposure zone 18, and is wound over a take-up roller 23 positioned downstream of the pressure developing unit 19. Further, a developer sheet cassette 21 which accommodates therein cut developer sheet stack 25 is provided. The developer sheet 25 passes through the pressure developing unit 19, and a thermal fixing unit 22.

The light from light source 4 is irradiated with a given width on the original 27 by the reflector members 1 and 3. At this time, as shown in FIG. 4, the cover 10 is moved together with the original by a moving unit (not shown) for undergoing light scanning with respect to the original in a direction indicated by an arrow A at the time of exposure. Since, at this time, the original 27 is moved in synchronism with the microcapsule sheet 24, a latent image corresponding to an image on the original 27 is formed on the sheet 24. The microcapsule sheet 24 carrying the latent image is then fed to the pressure-developing unit 19. At this time, the developer sheet 25 is fed out one by one from the developer-sheet cartridge 21 by means of a feed roller 20 and a guide roller 20a and are supplied, in close contact with the microcapsule sheet 24, to the pressure-developing unit 19. After these sheets 24 and 25 passing through the pressure-developing unit 19, both of the microcapsule and developer sheets 24 and 25 are separated from each other by a separation roller 19b, and the sheet 24 is wound around the take-up roller 23 through a guide roller 19c. The developer sheet 25 is fed, by means of sheet guide 21a, to the thermal fixing unit 22 for luster treatment on the image surface and is thereafter discharged out of the copying machine.

Figure 3A:
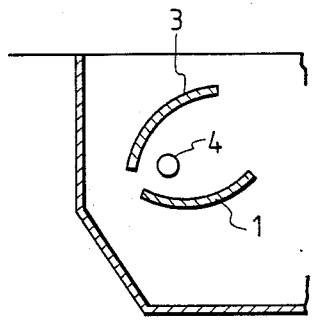
FIGS. 3A and 3B are diagrams for description of an operation of the exposure device according to this invention; and, FIG. 4 is a cross-sectional view showing one example of a copying machine incorporating therein the exposure device according to this invention.
Figure 3B:
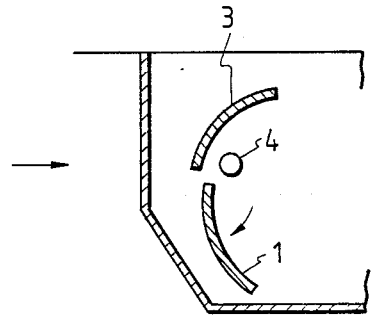

In the exposure device, the reflector member 1 mounted to the holder 30 is normally so positioned as to focus the light from the light source 4 onto the original 27, as shown in FIG. 3(a). For replacement of the light source 4, the guide pin 31b is moved out of the latch hole 34a of the side plate 32 and is moved along the guide groove 34, so that the holder 30 is pivoted around the guide pin 31a. As a result, a large open space is provided as shown in FIG. 3(b), thus providing sufficient space capable of facilitating replacement of the light source 4.

As described above, the space provided by pivotal motion of the reflector member can facilitate the replacement of the light source.

Needless to say, this invention is in no way restricted to the above particular embodiment, and can be modified in various manners within the spirit and scope of the invention. For instance, the reflector section 1 may be pivoted around the guide pin 31b, or the reflector section 3 may be rendered pivotable instead of the former reflector section 1. Alternately, either one of the reflector members may be detachably disposed.

As should be understood from the above detailed description, the exposure device of this invention provides space between the light source and the reflector for easy replacement of the light source.

We claim:

1. An exposure device in an image recording apparatus in which an image is formed on an image recording medium which image corresponds to an image of an original, said exposure device comprising:
    a light source having a back peripheral surface,
    a reflector means surrounding said back surface of said light source for reflecting a light from said light source onto an original, said reflector means comprising first and second separate bisected reflector members, and at least one of said first and second reflector members being disposed movable toward and away from remaining reflector member, whereby open space is provided for facilitating handling of said light source; and
    a side plate which constitutes a machine main body, said side plate being formed with an elongated slot and an arcuate guide groove, and wherein one of said reflector members comprises a main reflector plate member, a holder fixedly secured to an edge of said main reflector plate member, first protrusion extending from said holder and being engageable with said elongated slot, and a second protrusion extending from said holder and being engageable with said arcuate guide groove.

2. The exposure device as claimed in claim 1, wherein said image recording medium comprises a first image recording medium and a second image recording medium, said first image recording medium comprising photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material.

3. The exposure device as claimed in claim 1, wherein said side plate is further formed with a latch hole contiguous with said arcuate guide groove, said second protrusion being engageable with said latch hole during normal operation of said exposure device, and being disengaged therefrom to enter said arcuate groove, so that said reflector member is pivotable about said first protrusion.

* * * * *